United States Patent
Jang

(10) Patent No.: US 9,711,525 B2
(45) Date of Patent: Jul. 18, 2017

(54) THREE-DIMENSIONAL SEMICONDUCTOR DEVICE AND MANUFACTURING METHOD THEREOF

(71) Applicant: SK hynix Inc., Icheon-si Gyeonggi-do (KR)

(72) Inventor: Min Sik Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/792,164

(22) Filed: Jul. 6, 2015

(65) Prior Publication Data

US 2016/0225754 A1   Aug. 4, 2016

(30) Foreign Application Priority Data

Jan. 30, 2015   (KR) .................. 10-2015-0015472

(51) Int. Cl.
```
H01L 29/78      (2006.01)
H01L 29/66      (2006.01)
H01L 29/792     (2006.01)
H01L 27/11582   (2017.01)
```

(52) U.S. Cl.
CPC .............................. H01L 27/11582 (2013.01)

(58) Field of Classification Search
CPC . H01L 27/0207; H01L 27/108; H01L 27/115; H01L 29/6684; H01L 29/788; H01L 27/11517; H01L 29/42324; H01L 29/792
See application file for complete search history.

(56) References Cited

U.S. PATENT DOCUMENTS

2013/0313631 A1    11/2013  Yang et al.
2014/0063936 A1*   3/2014   Shim ................ H01L 27/11582
                                                         365/184

FOREIGN PATENT DOCUMENTS

KR      1020110131795 A      12/2011

* cited by examiner

*Primary Examiner* — Thomas L Dickey
*Assistant Examiner* — Damon Hillman
(74) *Attorney, Agent, or Firm* — William Park & Associates Ltd.

(57) ABSTRACT

Disclosed are a semiconductor device and a manufacturing method thereof. The semiconductor device includes: source select lines, word lines, drain select lines, and a bit line stacked on a substrate in which a first cell string region and a second cell string region are defined; channel layers and memory layers vertically passing through the source select lines, the word lines, and the drain select lines in each of the first cell string region and the second cell string region; and a common source line vertically passing through the source select lines, the word lines, and the drain select lines at centers of the first cell string region and the second cell string region, and extended to a lower side of the source select lines.

16 Claims, 12 Drawing Sheets

THREE-DIMENSIONAL SEMICONDUCTOR DEVICE AND MANUFACTURING METHOD THEREOF

CROSS-REFERENCE TO RELATED APPLICATIONS

The present application claims priority to Korean patent application number 10-2015-0015472 filed on Jan. 30, 2015, in the Korean Intellectual Property Office, the entire disclosure of which is incorporated by reference herein.

BACKGROUND

1. Technical Field

The invention relates to a semiconductor device and a manufacturing method thereof, and more particularly, to a semiconductor device including a three-dimensional memory device, and a manufacturing method thereof.

2. Related Art

A semiconductor device includes a memory device in which data is stored. For example, the memory device includes a memory cell array. The memory cell array includes a plurality of memory blocks, and each of the memory blocks includes a plurality of cell strings. The cell strings include a plurality of memory cells.

A three-dimensional memory device means a device in which cell strings are vertically formed on a substrate. For example, the memory cells may be stacked on the substrate in a vertical direction to form cell strings, and the cell strings may be formed in a structure shaped like "U" or "I" according to a structure of the cell strings. The cell strings having the U-shaped structure may include a plurality of memory cells arranged between a bit line and a pipe gate, and a plurality of memory cells arranged between a common source line and a pipe gate. The cell strings having the I-shaped structure may include a plurality of memory cells serially connected with each other between a bit line and a common source line.

SUMMARY

An embodiment of the invention provides a semiconductor device, including first and second cell strings arranged in parallel to each other. The semiconductor device also includes a bit line electrically coupled to one side of each of the first and second cell strings. The semiconductor device also includes a common source line electrically coupled to an other side of each of the first and second cell strings and extended between the first and second cell strings. In an embodiment of the invention provides a semiconductor device, including source select lines, word lines, drain select lines, and a bit line stacked on a substrate in which a first cell string region and a second cell string region are defined. The semiconductor device also includes channel layers and memory layers vertically passing through the source select lines, the word lines, and the drain select lines in each of the first cell string region and the second cell string region. Further, the semiconductor device includes a common source line vertically passing through the source select lines, the word lines, and the drain select lines at centers of the first cell string region and the second cell string region, and extended to a lower side of the source select lines.

In an embodiment of the invention provides a method of manufacturing a semiconductor device, including forming a structure including U-shaped channel structures vertically passing first insulating layers and first conductive layers alternately stacked on a substrate, and electrically coupled with in the substrate, and a slit vertically passing through the first insulating layers and the first conductive layers formed at a center of the U-shaped channel structures. The method also includes forming a first passivation layer on a lateral surface of the slit. The method also includes exposing a channel layer of the U-shaped channel structures through a lower side of the slit. The method also includes filling the slit, through which the channel layer is exposed, with a second conductive layer.

DETAILED DESCRIPTION

Hereinafter, an embodiment of the invention will be described with reference to the accompanying figures in detail. However, the invention is not limited to an embodiment disclosed below and may be implemented in various forms and the scope of the invention is not limited to the following embodiments. Rather, an embodiment is provided to more sincerely and fully disclose the invention and to completely transfer the spirit of the invention to those skilled in the art to which the invention pertains. Further, the scope of the invention should be understood by the claims of the invention. The invention has been made in an effort to provide a semiconductor device and a manufacturing method thereof, in which a three-dimensional memory device may be easily formed by forming a common source line in a pipe gate region. According to an embodiment of the invention, it is possible to easily form a cell string having an "I"-shaped structure sharing a common source line by forming the common source line in a pipe gate region. Further, it is possible to increase capacitance and improve an electric characteristic by increasing a stack height of a three-dimensional memory device.

Figure 1:
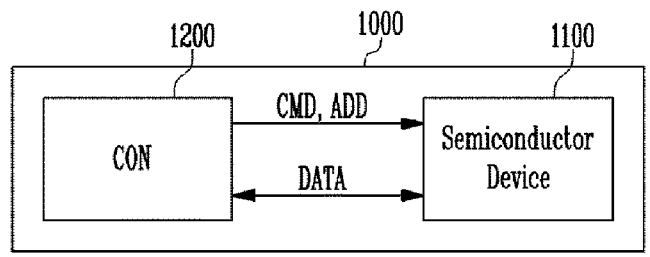
FIG. 1 is a diagram for describing a semiconductor system.

Referring to FIG. 1, a diagram for describing a semiconductor system is illustrated.

In FIG. 1, a semiconductor system 1000 includes a semiconductor device 1100 storing data and a control device (CON) 1200 controlling the semiconductor device 1100. For example, the control device 1200 outputs a command signal CMD and an address ADD to the semiconductor device 1100 by a command received from the outside. The semiconductor device 1100 performs program, read, and erase operations according to the command signal CMD and the address ADD. Further, the semiconductor device 1100 and the control device 1200 also transceive data DATA.

Figure 2:
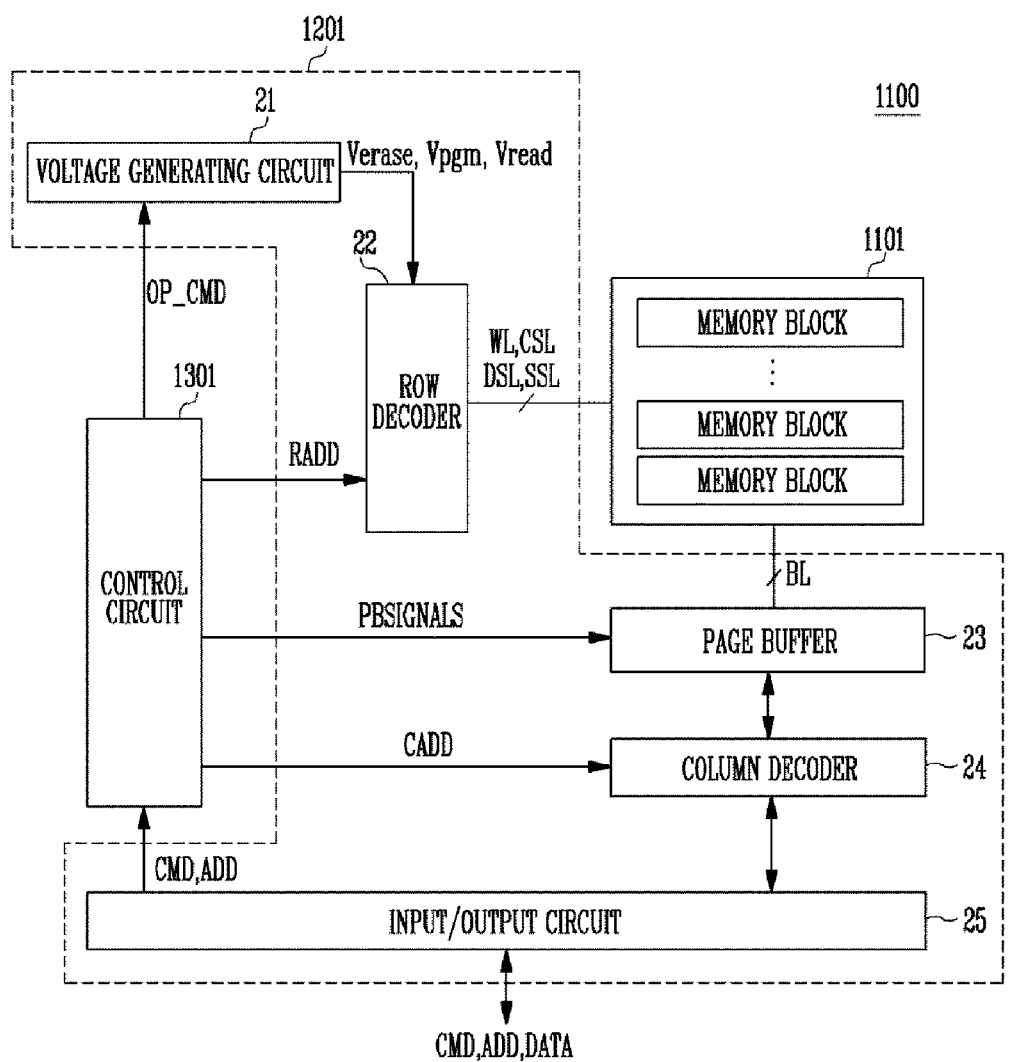
FIG. 2 is a diagram for describing the semiconductor device included in a semiconductor system.

Referring to FIG. 2, a diagram for describing the semiconductor device included in a semiconductor system is illustrated.

In FIG. 2, the semiconductor device 1100 includes a memory cell array 1101 storing data, a circuit group 1201 performing program, read, and erase operations of the memory cell array 1101, and a control circuit 1301 controlling the circuit group 1201.

The memory cell array 1101 includes a plurality of memory blocks, which are identically configured. Further, the memory blocks include a plurality of cell strings. The cell strings include a plurality of memory cells. The memory cells included in the cell strings are formed in a three-dimensional structure in which the memory cells are stacked on a substrate in a vertical direction.

The circuit group 1201 includes a voltage generating circuit 21, a row decoder 22, a page buffer 23, a column decoder 24, and an input/output circuit 25.

The voltage generating circuit 21 generates various operating voltages according to an operation command signal OP_CMD. The operation command signal OP_CMD may include a program command signal, a read command signal, and an erase command signal. For example, when a program command signal is applied to the voltage generating circuit 21, the voltage generating circuit 21 generates voltages with various levels related to a program operation including a program voltage Vpgm. In addition, when a read command signal is applied to the voltage generating circuit 21, the voltage generating circuit 21 generates voltages with various levels related to a read operation including a read voltage Vread. Further, when an erase command signal is applied to the voltage generating circuit 21, the voltage generating circuit 21 generates voltages with various levels related to an erase operation including an erase voltage Verase.

The row decoder 22 transmits operation voltages to word lines WL, drain select lines DSL, source select lines SSL, and common source lines CSL electrically coupled to a memory block selected from among the memory blocks included in the memory cell array 110 according to a road address RADD.

The page buffer 23 is electrically coupled with the memory blocks through bit lines BL. The page buffer 23 transceives data with a selected memory block during the program, read, or erase operation in response to page buffer control signals PBSIGNALS. The page buffer 23 also temporarily stores received data.

The column decoder 24 transceives data with the page buffer 23 in response to the column address CADD.

The input/output circuit 25 transmits the command signal CMD and the address ADD received from the outside to the control circuit 130. The input/output circuit 25 transmits the data DATA received from the outside to the column decoder 24. In addition, the input/output circuit 25 also outputs the data DATA received from the column decoder 24 to the outside or transmits the data DATA received from the column decoder 24 to the control circuit 1301.

The control circuit 1301 outputs an operation command signal OP_CMD, a row address RADD, page buffer control signals PBSIGNALS, and a column address CADD for controlling the circuit group 1201 according to the command signal CM and the address ADD.

Figure 3:
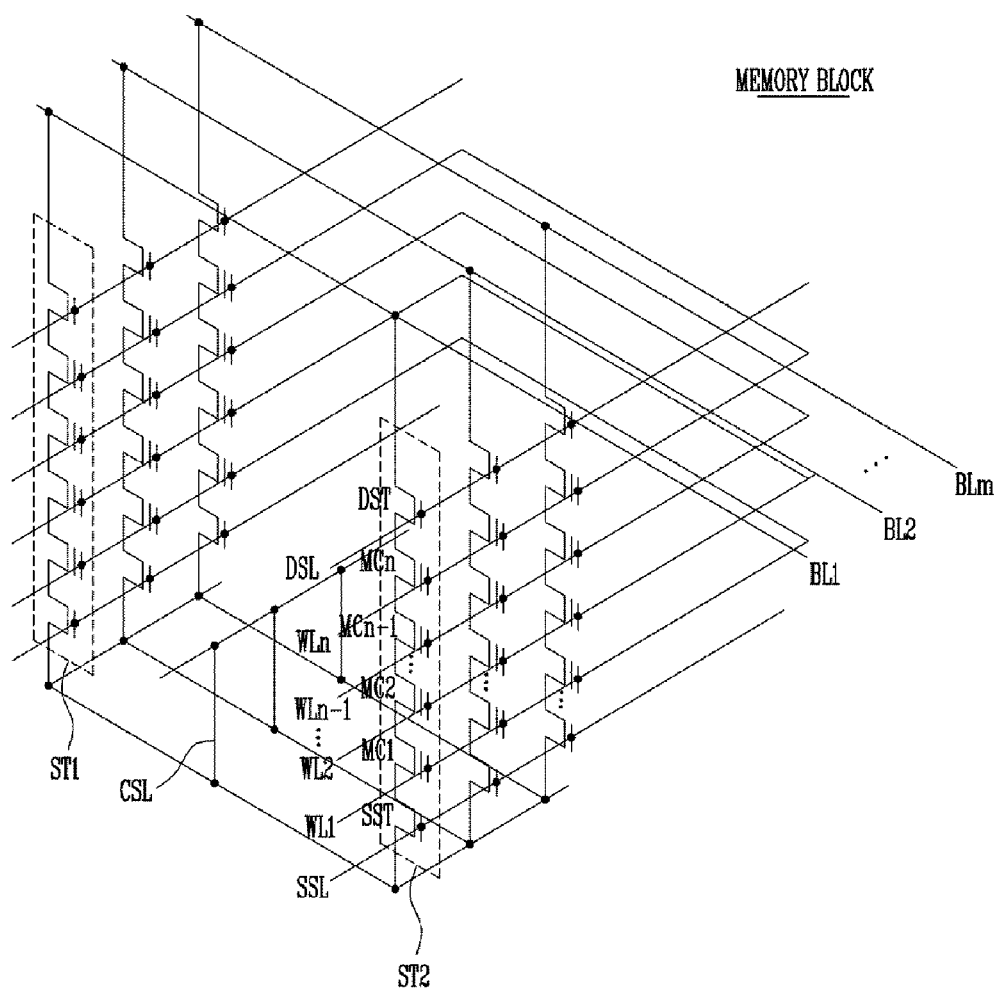
FIG. 3 is a circuit diagram for describing a memory block included in the semiconductor device.

Referring to FIG. 3, a circuit diagram for describing a memory block included in the semiconductor device is described.

In FIG. 3, the memory block may include a plurality of cell strings ST1 to ST2. The cell strings 11 includes source select transistors SST, memory cells MC1 to MCn (n is a positive integer), and drain select transistors DST serially connected between the common source lines CSL and bit lines BL1 to BLm (m is a positive integer).

Sources of the source select transistors SST are electrically coupled to the common source lines CSL. In addition, drains of the drain select transistors DST are electrically coupled to the bit lines BL1 to BLm. Gates of the source select transistors SST are electrically coupled to the source select lines SSL. Gates of the memory cells MC1 to MCn are electrically coupled to word lines WL1 to WLn. Further, gates of the drain select transistors DST are electrically coupled to the drain select lines DSL.

The memory blocks are arranged in a three-dimensional structure. The memory cells MC1 to MCn within the cell strings ST1 and ST2 may have a structure in which the memory cells MC1 to MCn are serially connected in the vertical direction with respect to planes parallel to an upper surface of the substrate. In particular, the common source lines CSL are arranged between the cell strings ST1 and ST2, and the cell strings ST1 and ST2 are commonly electrically coupled through wires. For example, when it is assumed that "ST1" is a first cell string and "ST2" is a second cell string, the common source lines CSL are arranged between the first cell string ST1 and the second cell string ST2, and are commonly electrically coupled through lower wires of the first and second cell strings ST1 and ST2.

A method of manufacturing a semiconductor device will be described based on an example of cross-sections of the first cell string ST1 and the second cell string ST2 below.

Referring to FIGS. 4A, 4B, 4C, 4D, 4E and 4F, cross-sectional views for describing a method of manufacturing a semiconductor device according to an embodiment of the invention are shown.

Figure 4A:
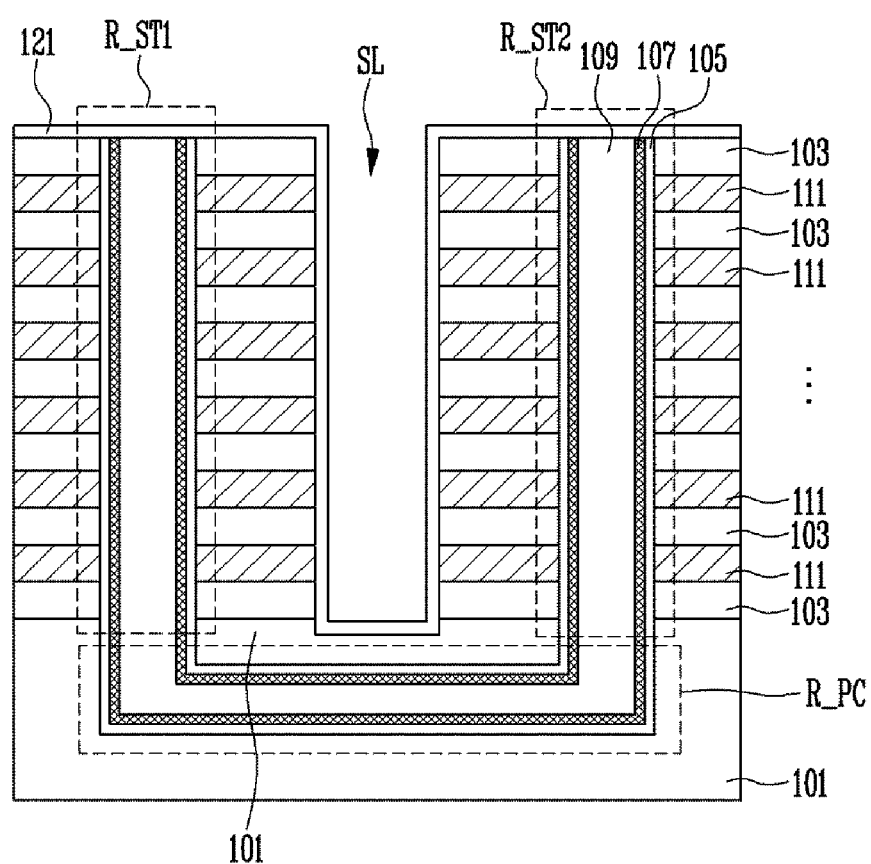
FIGS. 4A to 4F are cross-sectional views for describing a method of manufacturing a semiconductor device according to an embodiment of the invention.

In FIG. 4A, there is provided U-shaped channel structures 105, 107 and 109, and a slit SL. The channel structures 105, 107 and 109 are vertically pass through in a first cell string region R_ST1 and a second cell string region R_ST2 of first insulating layers 103 and first conductive layers 111 which are alternately stacked on a substrate 101, and extended through a pipe region R_PC which is between the first cell string region R_ST1 and the second cell string region R_ST2. The slit SL is vertically pass through the first insulating layers 103 and the first conductive layers 111 formed at a center of the U-shaped structures 105, 107, and 109.

The first insulating layers 103 may be formed of oxide layers. The first conductive layers 111 may be formed of metal layers such as a tungsten layer. The U-shaped channel structure 105, 107, and 109 may formed of layers electrically coupling the first cell string region R_ST1, the pipe region R_PC, and the second cell string region R_ST2. For example, the layers of the U-shaped channel structure 105, 107, and 109 may include a memory layer 105, a channel layer 107, and a second insulating layer 109. The memory layer 105 may include an oxide layer, a nitride layer, and an oxide layer which are sequentially formed. The channel layer 107 may be formed of a conductive layer such as a polysilicon layer. The second layer 109 may be formed of an oxide layer.

A passivation layer 121 is formed along a surface of the entire structure provided with the slit SL. The passivation layer 121 may be formed of an insulating layer. The insulating layer for the passivation layer 121 is formed of a material having different etch selectivity from that of the substrate 101 and the U-changed channel structures 105, 107, and 109. Most preferably, the insulating layer for the passivation layer 121 is formed of a material having a low etch speed than that of the substrate 101 and the U-changed channel structures 105, 107, and 109.

Figure 4B:
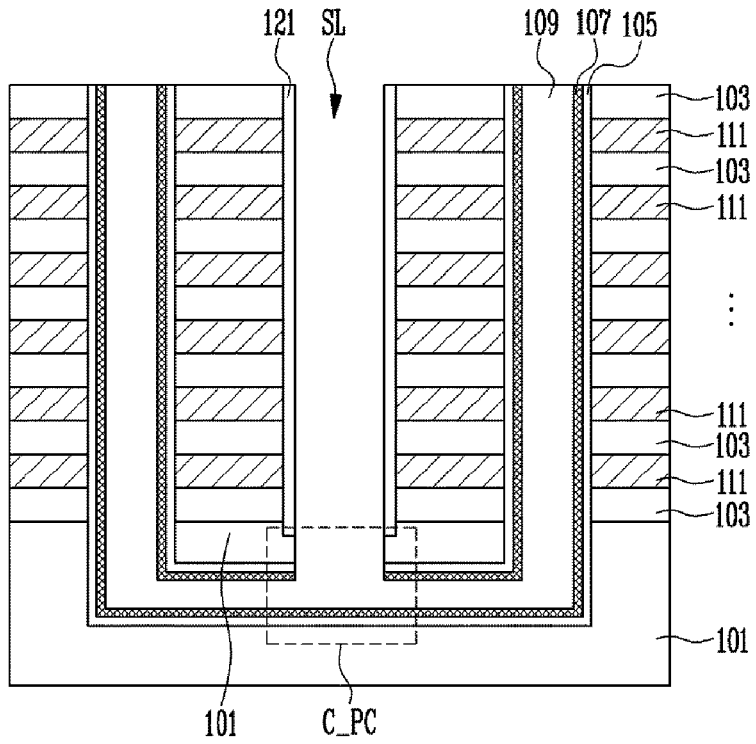
Figure 4C:
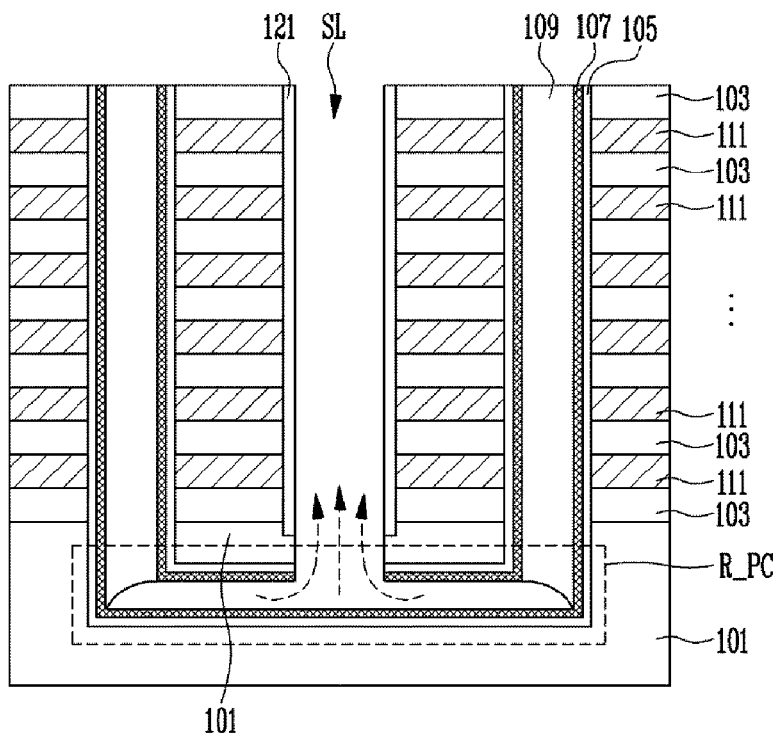

In FIG. 4B, an etch process is performed to expose the second insulating layer 109 under the slit SL. The etch process may be performed by a blanket etch. For example, the etch process may be performed until the channel layer 107 formed at a lower side in the channel layer 107 formed at a center C_PC of the pipe region R_PC (see FIG. 4A) is exposed. In this case, the passivation layer 121 is left on a lateral surface of the slit SL so that the first insulating layers 103 and the first conductive layers 111 are not damaged during the etch process.

In FIG. 4B, an etch process is performed to remove a part of the second insulating layer 109 exposed to the lower side of the slit SL. The etch process may be performed by a wet etch process. For example, the channel layer 107 formed in the pipe region R_PC is exposed by removing the second insulating layer 109 formed in the pipe region R_PC by performing the wet etch process.

Figure 4D:
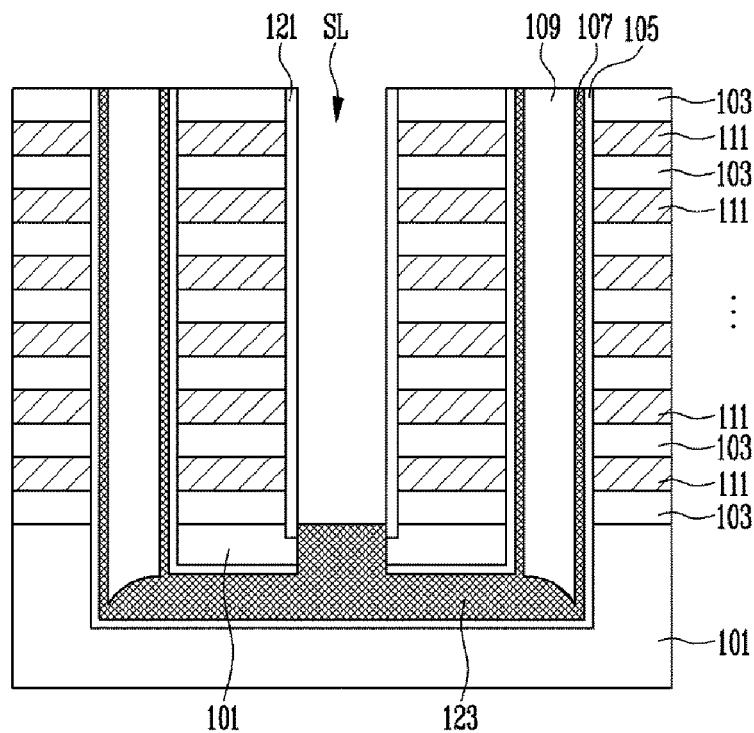

In FIG. 4D, the pipe region R_PC is filled with a second conductive layer 123. The second conductive layer 123 may be formed of the same material as the channel layer 107. For example, the second conductive layer 123 may be formed of a polysilicon layer. The polysilicon layer for the second conductive layer 123 may be formed by a selective deposition method to fill the pipe region R_PC. The channel layer 107 within the pipe region R_PC is exposed through the lower side of the slit SL so that it is possible to form the second conductive layer 123 by a selected deposition method using the exposed channel layer 107 as a seed.

Figure 4E:
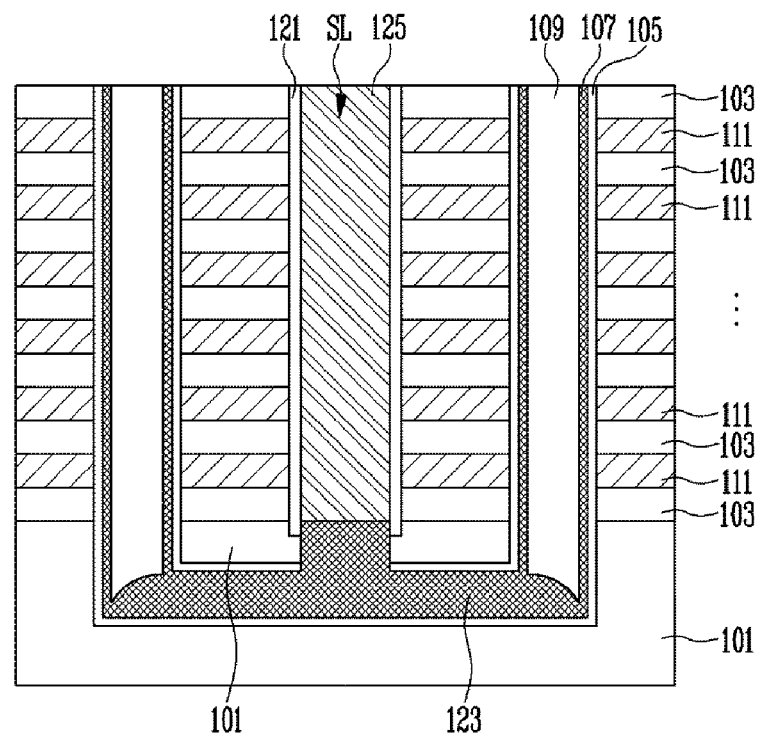

In FIG. 4E, the slit SL is filled with a third conductive layer 125. The third conductive layer 125 may be formed of a metal layer having lower resistance than that of the second conductive layer 123. For example, the third conductive layer 125 may be formed of tungsten.

Figure 4F:
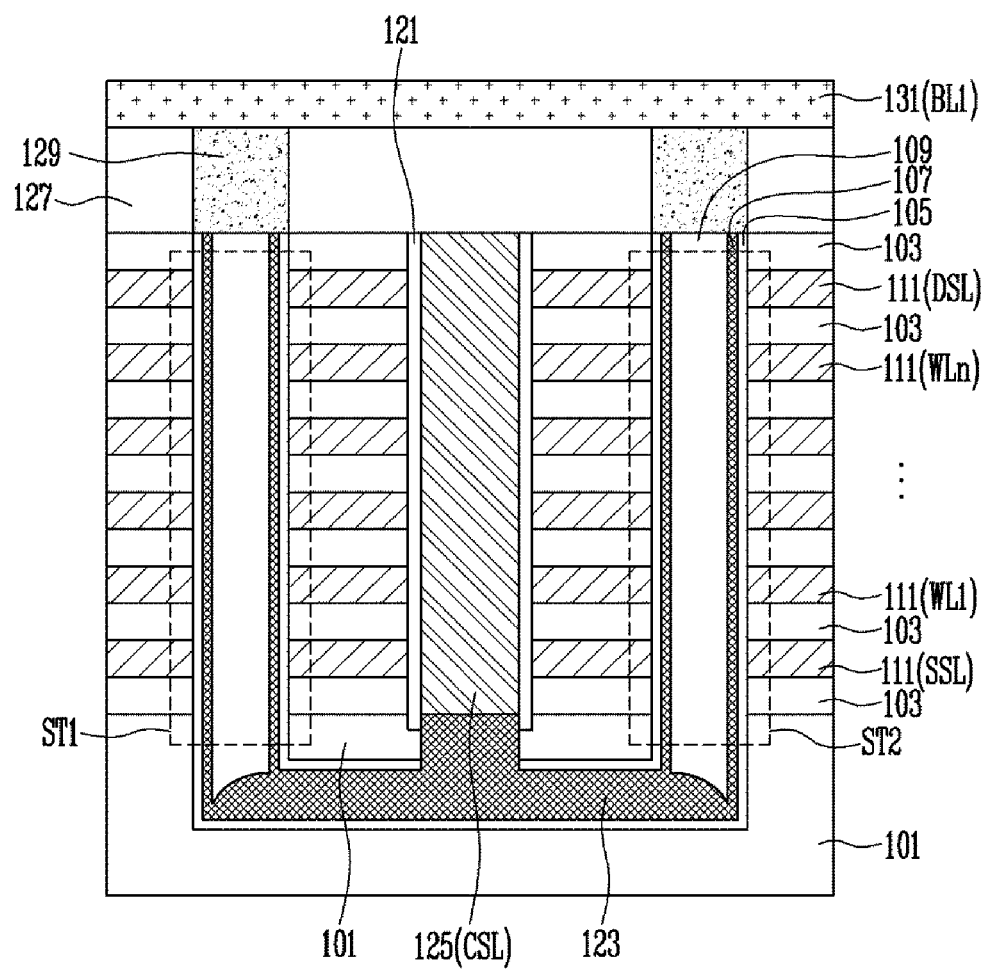

In FIG. 4F, a third insulating layer 127 is formed on an entire structure in which the third conductive layer 125 is formed. A hole is formed so as to expose the channel layer 107. In addition, a via is formed by filling the hole with a fourth conductive layer 129. The fourth conductive layer 129 may be formed of a polysilicon layer or a tungsten layer. A fifth conductive layer 131, which is in contact with the fourth conductive layer 129, is formed in an entire structure in which the fourth conductive layer 129 is formed. The fifth conductive layer 131 may be formed of a metal layer. For example, the fifth conductive layer 131 may be formed of a polysilicon layer or a tungsten layer. The fourth conductive layer 129 may be formed of a material to have a lower resistance than the third conductive layer 125.

A final structure formed by the aforementioned manufacturing method has a configuration in which a common source line CSL is formed between the first cell string ST1 and the second cell string ST2. In particular, the fifth conductive layer 131 becomes a first bit line BL1. Further, the third conductive layer 125 and the second conductive layer 123 become the common source line CSL. The first conductive layer 111 at the bottommost end among the first conductive layers 111 becomes the source select line SSL. In addition, the first conductive layer 111 at the topmost end becomes the drain select line DSL. According to the semiconductor device, the source select line SSL and the drain select line DSL may be formed of the plurality of first conductive layers 111. The first conductive layers 111 formed between the source select line SSL and the drain select line DSL become the word lines WL1 to WLn. The first and second cell strings ST1 and ST2 are disposed at both ends of the third conductive layer 125 for the common source line CSL. Further, the second conductive layer 123 electrically coupled to lower sides of the first and second cell strings ST1 and ST2 becomes the common source line CSL together with the third conductive layer 125.

During the operation of the semiconductor device, a source voltage generated by the voltage generating circuit 21 (see FIG. 2) is transmitted to the third conductive layer 125 for the common source line of the selected memory block through the row decoder 22 (see FIG. 2). Further, the source voltage is transmitted to the first and second cell strings ST1 and ST2 through the second conductive layer 123 which is in contact with the third conductive layer 125.

Referring to FIGS. 5A, 5B, 5C, 5D, 5E and 5F, cross-sectional views for describing a method of manufacturing a semiconductor device according to an embodiment of the invention are shown.

Figure 5A:
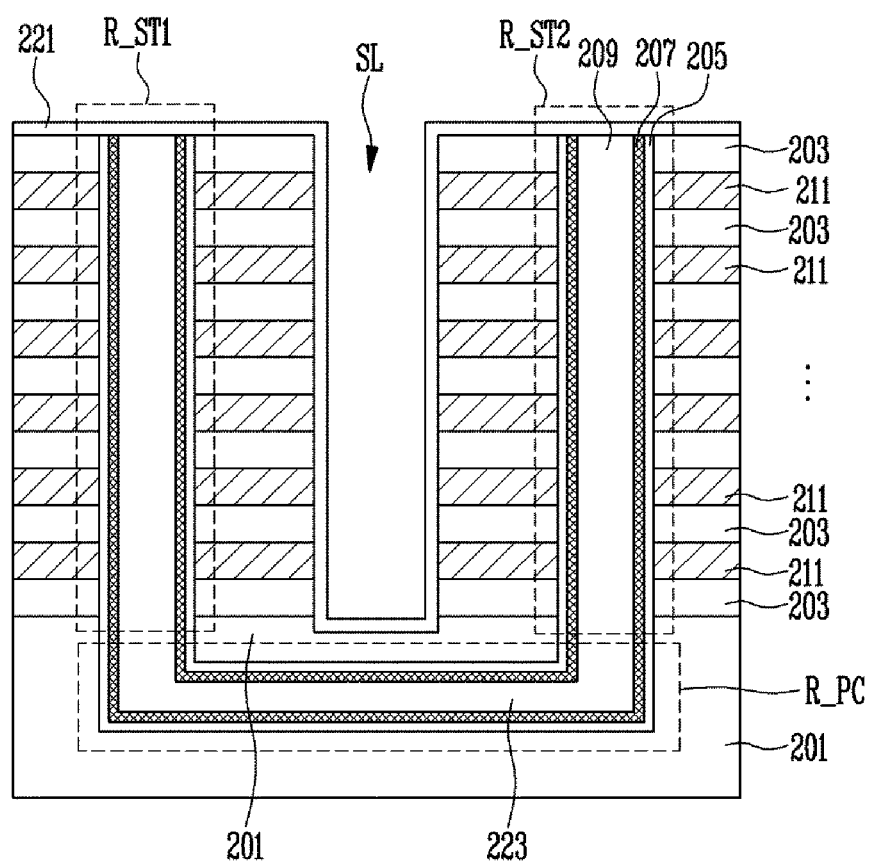
FIGS. 5A to 5F are cross-sectional views for describing a method of manufacturing a semiconductor device according to an embodiment of the invention.

In FIG. 5A, there is provided a stack structure including U-shaped channel structure 205, 207 and 209, and a slit SL. The channel structure 205, 207, and 209 are vertically pass through in a first cell string region R_ST1 and a second cell string region R_ST2 of first insulating layers 203 and first conductive layers 211 which are alternately stacked on a substrate 201, and extended through a pipe region R_PC which is between the first cell string region R_ST1 and the second cell string region R_ST2. The slit SL is vertically pass through the first insulating layers 203 and the first conductive layers 211 formed at a center of the U-shaped structures 205, 207, and 209.

The first insulating layers 203 may be formed of oxide layers. The first conductive layers 211 may be formed of metal layers such as tungsten layers. The U-shaped channel structures 205, 207, and 209 may formed of layers electrically coupling the first cell string region R_ST1, the pipe region R_PC, and the second cell string region R_ST2. For example, the layers of the U-shaped channel structure 205, 207, and 209 may include a memory layer 205, a channel layer 207, and a second insulating layer 209. The memory layer 205 may include an oxide layer, a nitride layer, and an oxide layer which are sequentially formed. The channel layer 207 may be formed of a conductive layer such as a polysilicon layer. The second layer 209 may be formed of an oxide layer.

A first passivation layer 221 is formed along a surface of the entire structure provided with the slit SL. The first passivation layer 221 may be formed of an oxide layer. The insulating layer for the first passivation layer 221 is formed of a material having different etch selectivity from that of the substrate 201 and the U-changed channel structures 205, 207, and 209. Most preferably, the insulating layer for the first passivation layer 221 is formed of a material having a low etch speed than that of the substrate 201 and the U-changed channel structures 205, 207, and 209.

Figure 5B:
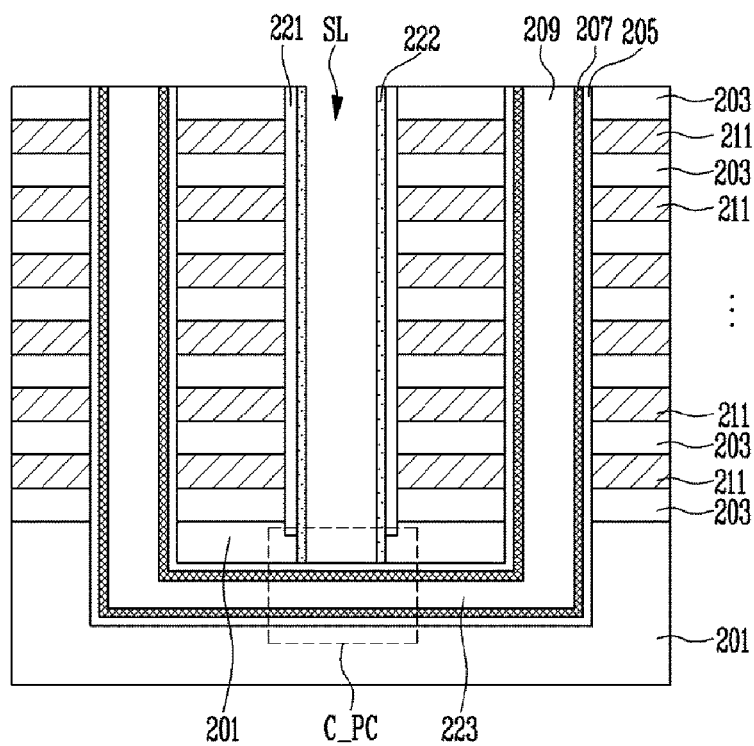

In FIG. 5B, an etch process is performed to expose a memory layer 205 under the slit SL. The etch process may be performed by a blanket etch. For example, the etch process may be performed until the memory layer 205 formed at an upper side in the channel layer 205 formed at a center C_PC of the pipe region R_PC (see FIG. 5A) is exposed. In this case, the first passivation layer 221 is left on a lateral surface of the slit SL so that the first insulating layers 203 and the first conductive layers 211 are not damaged during the etch process.

The first passivation layer 221 may be partially damaged during the etch of a lower region of the slit SL. Further, when the first passivation layer 221 is damaged, the first conductive layers 211 may be exposed through the slit SL during a subsequent process. To prevent the first conductive layers 211 from being exposed through the slit SL, a second passivation layer formed of the same material as that of the first passivation layer 221 may be further formed along a lateral surface of the first passivation layer 221. The second passivation layer 222 may be formed by a similar method to the forming method of the first passivation layer 221. For example, after forming the second passivation layer 222 along a surface of the entire structure in which the first passivation layer 221 is formed, the second passivation layer 222 formed in the remaining region, except for the second passivation layer 222 formed on the lateral surface of the first passivation layer 221 may be removed by performing the blanket etch process. Accordingly, the memory layer 205 is exposed to the lower side of the slit SL.

Figure 5C:
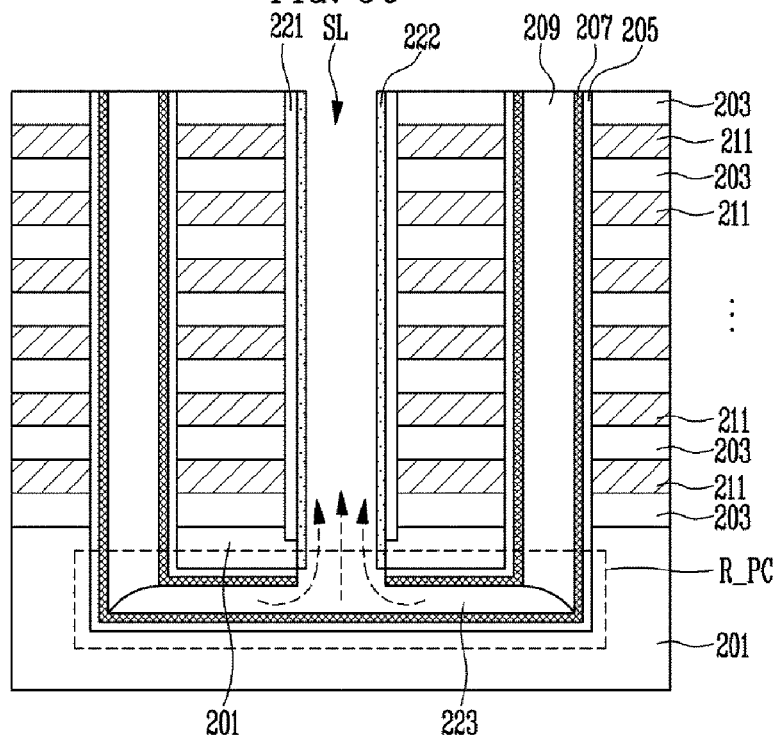

In FIG. 5C, the second insulating layer 209 is exposed by sequentially etching the memory layer 205 and the channel layer 207 exposed to the lower side of the slit SL. The etch process for exposing the second insulating layer 209 may be performed by a dry etch process. Next, an etch process is performed to remove a part of the second insulating layer 209 exposed to the lower side of the slit SL. The etch process may be performed by a wet etch process. For example, the channel layer 207 formed within the pipe region R_PC is exposed by removing the second insulating layer 209 formed in the pipe region R_PC by performing the wet etch process. Although not illustrated in the figures, a first mask pattern may be formed on the first insulating layer 203 at the topmost end to prevent the first insulating layer 203 at the topmost end among the first insulating layers 203, and then the etch process may be performed.

Figure 5D:
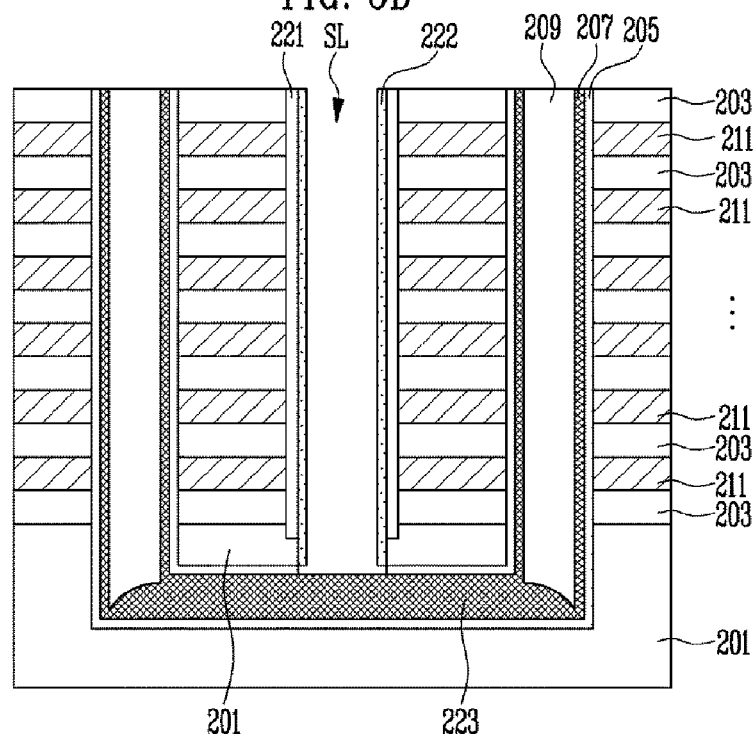

In FIG. 5D, the pipe region R_PC is filled with a second conductive layer 223. The second conductive layer 223 may be formed of the same material as the channel layer 207. For example, the second conductive layer 223 may be formed of a polysilicon layer. The polysilicon layer for the second conductive layer 223 may be formed by a selective deposition method to fill the pipe region R_PC. The channel layer 207 within the pipe region R_PC is exposed through the lower side of the slit SL so that it is possible to form the second conductive layer 223 by a selected deposition method using the exposed channel layer 207 as a seed.

Figure 5E:
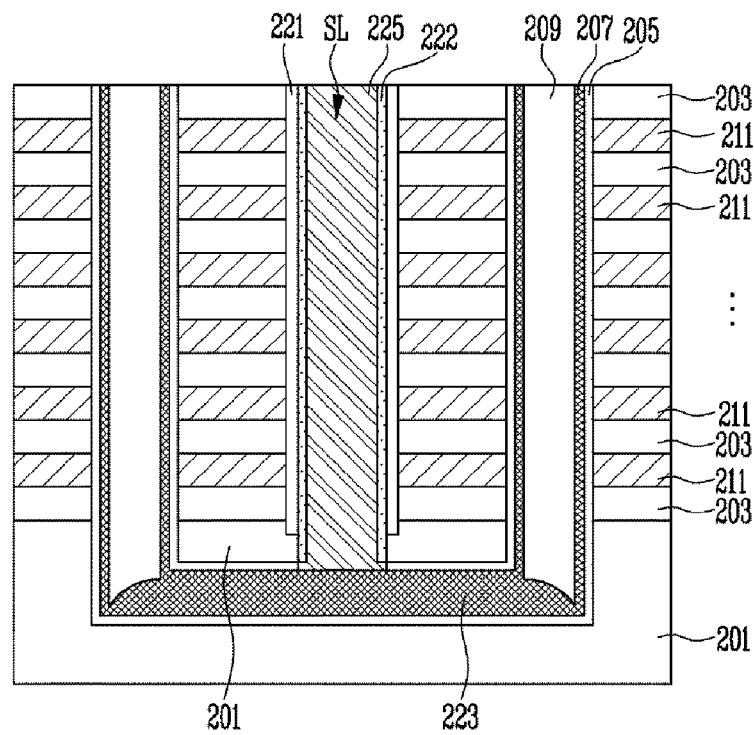

In FIG. 5E, the slit SL is filled with a third conductive layer 225. The third conductive layer 225 may be formed of a metal layer having lower resistance than that of the second conductive layer 223. For example, the third conductive layer 225 may be formed of tungsten.

Figure 5F:
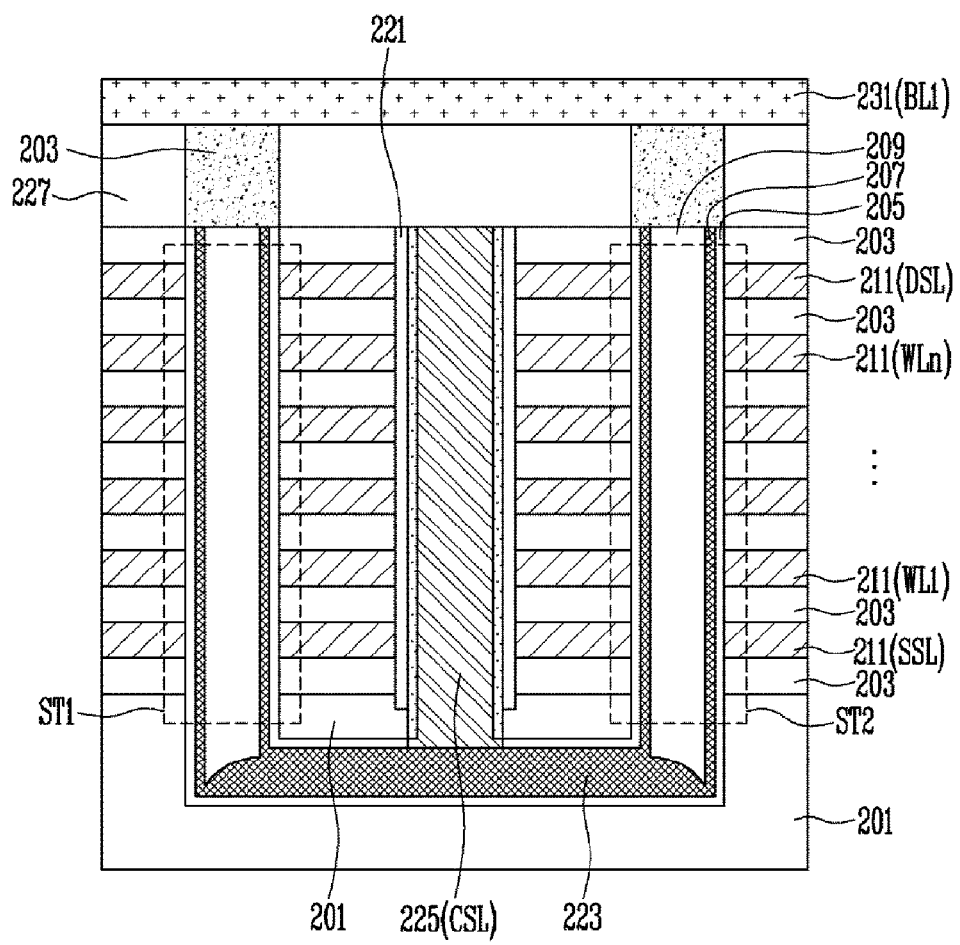

In FIG. 5F, a third insulating layer 227 is formed on an entire structure in which the third conductive layer 125 is formed. A hole is formed to expose the channel layer 207. Further, a via is formed by filling the hole with a fourth conductive layer 229. The fourth conductive layer 229 may be formed of a polysilicon layer or a tungsten layer. A fifth conductive layer 229, which is in contact with the fourth conductive layer 229, is formed in an entire structure in which the fourth conductive layer 229 is formed. The fifth conductive layer 231 may be formed of a metal layer. For example, the fifth conductive layer 231 may be formed of a polysilicon layer or a tungsten layer.

A final structure formed by the aforementioned manufacturing method has a configuration in which a common source line CSL is formed between the first cell string ST1 and the second cell string ST2. In particular, the fifth conductive layer 231 serves as a first bit line BL1. In addition, the third conductive layer 225 and the second conductive layer 223 serve as the common source line CSL. The first conductive layer 211 at the bottommost end among the first conductive layers 211 becomes the source select line SSL. Further, the first conductive layer 211 at the topmost end becomes the drain select line DSL. According to the semiconductor device, the source select line SSL and the drain select line DSL may be formed of the plurality of first conductive layers 211. The first conductive layers 211 formed between the source select line SSL and the drain select line DSL become the word lines WL1 to WLn. The first and second cell strings ST1 and ST2 are disposed at both ends of the third conductive layer 225 for the common source line CSL. Further, the second conductive layer 223 electrically coupled to lower sides of the first and second cell strings ST1 and ST2 becomes the common source line CSL together with the third conductive layer 225.

During the operation of the semiconductor device, a source voltage generated by the voltage generating circuit 21 (see FIG. 2) is transmitted to the third conductive layer 125 for the common source line of the selected memory block through the row decoder 22 (see FIG. 2). In addition, the source voltage is transmitted to the first and second cell strings ST1 and ST2 through the second conductive layer 123 which is in contact with the third conductive layer 125.

Figure 6:
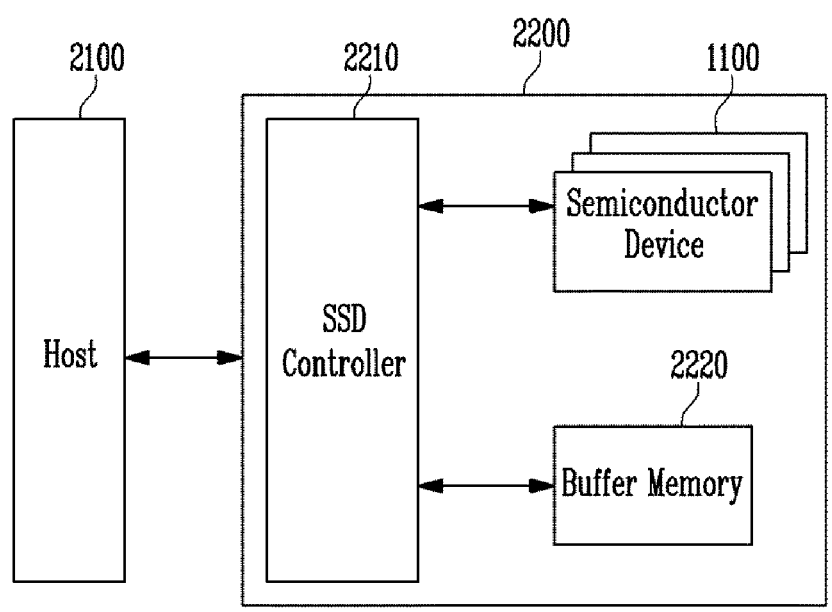
FIG. 6 is a block diagram illustrating a solid state drive including the semiconductor device according to an embodiment of the invention.

Referring to FIG. 6, a block diagram for describing a solid state drive including the semiconductor memory device according to an embodiment of the invention is described.

In FIG. 6, a drive device 2000 includes a host 2100 and a Solid State Disk (SSD) 2200. The SSD 2200 includes an SSD controller 2210, a buffer memory 2220, and a semiconductor device 1100.

The SSD controller 2210 physically connects the host 2100 and the SSD 2200. The SSD controller 2210 provides interface with the SSD 2200 in response to a bus format of the host 2100. In particular, the SSD controller 2210 decodes a command provided from the host 2100. As a result of the decoding, the SSD controller 2210 accesses the semiconductor device 1100. The bus format of the host 2100 may include a Universal Serial Bus (USB), a Small Computer System Interface (SCSI), PCI process, ATA, Parallel ATA (PATA), Serial ATA (SATA), and Serial Attached SCSI (SCSI).

Program data provided from the host 2100 and data read from the semiconductor device 1100 is temporarily stored in the buffer memory 2220. When data existing in the semiconductor device 1100 is cached when a read request is made from the host 2100, the buffer memory 2200 supports a cache function of directly providing the cached data to the host 2100. In general, a data transmission speed by the bus format (for example, SATA or SAS) of the host 2100 may be faster than a transmission speed of a memory channel. More specifically, when an interface speed of the host 2100 is faster than the transmission speed of the memory channel of the SSD 2200, it is possible to minimize degradation of performance generated due to a speed difference by providing the buffer memory 2220 with large capacity. The buffer memory 2220 may be provided as a synchronous DRAM so that the SSD 2200 used as an auxiliary memory device with large capacity provides sufficient buffering.

The semiconductor device 1100 is provided as a storage medium of the SSD 2200. For example, the semiconductor device 1100 may be provided as a non-volatile memory device having large capacity storage performance as described with reference to FIG. 2, particularly, a NAND-type flash memory among the non-volatile memory devices.

Figure 7:
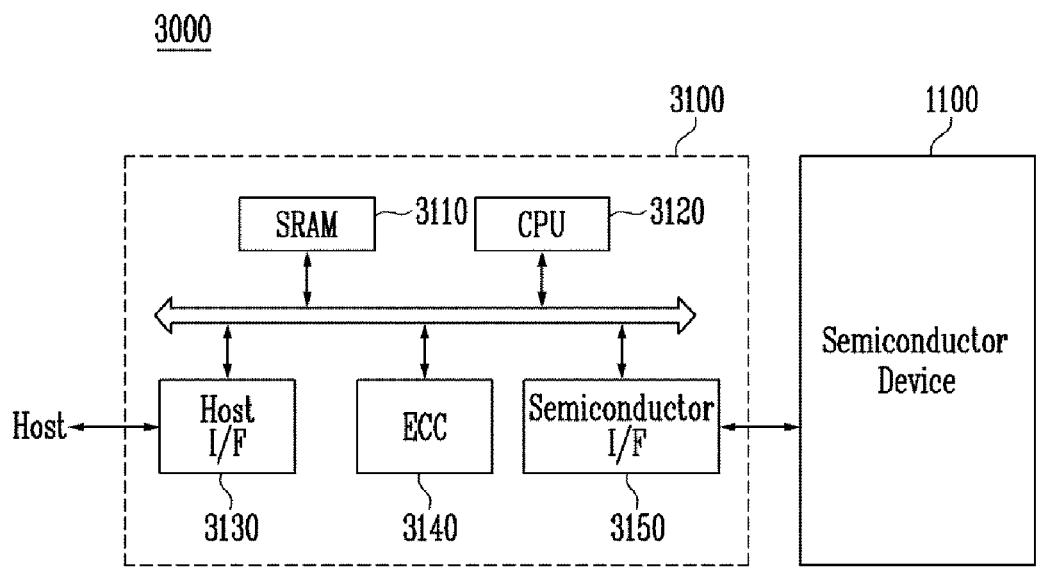
FIG. 7 is a block diagram for describing a memory system including the semiconductor device according to an embodiment of the invention.

Referring to FIG. 7, a block diagram for describing a memory system including the semiconductor device according to an embodiment of the invention is shown.

In FIG. 7, a memory system 3000 according to the invention may include a memory controller 3100 and the semiconductor device 1100.

The semiconductor device 1100 may have a configuration substantially the same as that of FIG. 2, so that a detailed description of the semiconductor device 1100 will be omitted accordingly.

A memory controller 3100 may be configured to control the semiconductor device 1100. The SRAM 3110 may be used as a working memory of a CPU 3120. A host interface (Host I/F) 3130 may include a data exchange protocol of a host electrically coupled with the memory system 3000. An error correction circuit (ECC) 3140 provided in the memory controller 3100 may detect and correct an error included in data read from the semiconductor device 1100. A semiconductor interface (semiconductor I/F) 3150 may interface with the semiconductor device 1100. The CPU 3120 may perform a control operation for data exchange of the memory controller 3100. Further, although not illustrated in FIG. 7, the memory system 3000 may further include a ROM for storing code data for interfacing with the host.

The memory system 3000 according to the invention may be applied to a computer, a portable terminal, a Ultra Mobile PC (UMPC), a work station, a net-book computer, a PDA, a portable computer, a web tablet PC, a wireless phone, a mobile phone, a smart phone, a digital camera, a digital audio recorder, a digital audio player, a digital picture recorder, a digital picture player, a digital video recorder, a digital video player, a device capable of transceiving information in a wireless environment, and one of various devices configuring a home network.

Figure 8:
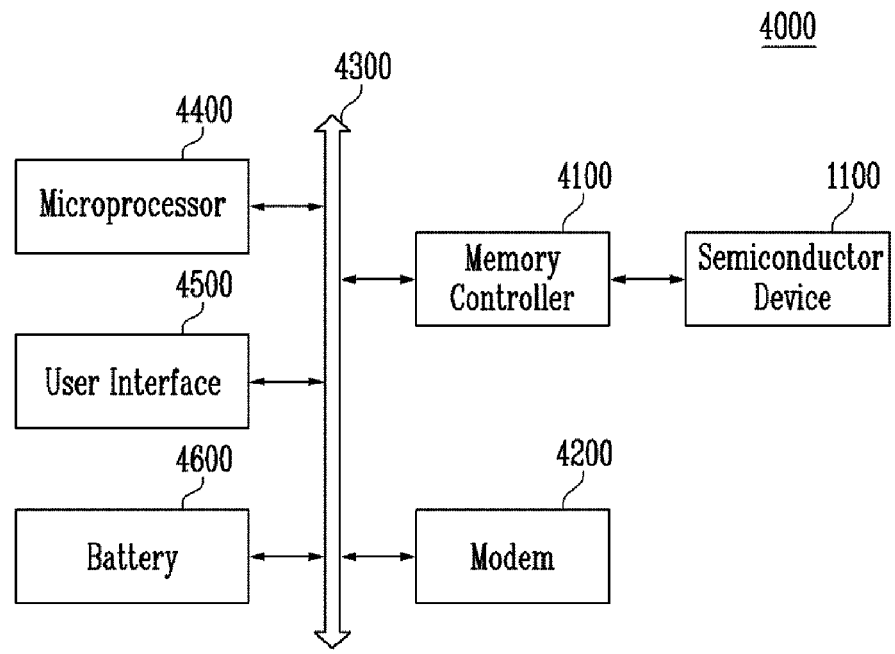
FIG. 8 is a diagram for describing a schematic configuration of a computing system including the semiconductor device according to an embodiment of the invention.

Referring to FIG. 8, a diagram for describing a schematic configuration of a computing system including the semiconductor device according to an embodiment of the invention is described.

In FIG. 8, a computing system 4000 according to the invention includes the semiconductor device 1100, the memory controller 4100, a modem 4200, a microprocessor 4400, and a user interface 4500 electrically coupled to the bus 4300. Where the computing system 4000 according to the invention is a mobile device, a battery 4600 for supplying an operating voltage of the computing system 4000 may be further provided. Although it is not illustrated in the figure, the computing system 4000 according to the invention may further include an application chipset, a Camera Image Processor (CIS), a mobile DRAM, and the like.

The semiconductor device 1100 may have a configuration substantially the same as that of FIG. 2, so that a detailed description of the semiconductor device 1100 will be omitted as a result.

The memory controller 4100 and the semiconductor device 1100 may configure an SSD.

The semiconductor device and the memory controller according to the invention may be embedded by using various forms of package. For example, the semiconductor device and the memory controller according to the invention may be embedded by using packages, such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi chip package (MCP), wafer-level fabricated package (WFP), and wafer-level processed stack package (WSP).

As described above, an embodiment has been disclosed in the figures and the specification. The specific terms used herein are for purposes of illustration and do not limit the scope of the invention defined in the claims. Accordingly, those skilled in the art will appreciate that various modifications and another equivalent example may be made without departing from the scope and spirit of the invention. Therefore, the sole technical protection scope of the invention will be defined by the technical spirit of the accompanying claims.

What is claimed is:

1. A method of manufacturing a semiconductor device, comprising:
   forming a structure including U-shaped channel structures vertically passing through first insulating layers and first conductive layers alternately stacked on a substrate, and electrically coupled in the substrate, and a slit vertically passing through the first insulating layers and the first conductive layers formed at a center of the U-shaped channel structures;
   forming a first passivation layer on a lateral surface of the slit;
   exposing a channel layer of the U-shaped channel structures through a lower side of the slit; and
   filling the slit, through which the channel layer is exposed, with a second conductive layer; and
   performing a wet etch process by exposing the channel layer formed in a pipe region by removing a third insulating layer formed in the pipe region.

2. The method of claim 1, wherein the forming of the first passivation layer on the lateral surface of the slit includes:
   forming the first passivation layer along a surface of an entire structure in which the slit is formed; and
   performing a blanket etch process so that the first passivation layer is left only on the lateral surface of the slit.

3. The method of claim 1, wherein the first passivation layer is formed of a second insulating layer.

4. The method of claim 3, wherein the second insulating layer is formed of a material having a lower etch speed than that of the substrate and the U-shaped channel structures.

5. The method of claim 1, further comprising:
   forming a second passivation layer along a lateral surface of the first passivation layer before the filling of the slit with the second conductive layer.

6. The method of claim 5, wherein the second passivation layer is formed of the same material as that of the first passivation layer.

7. The method of claim 3, wherein the U-shaped channel structures include a memory layer, a channel layer, and a third insulating layer.

8. The method of claim 1, wherein the first insulating layers and the first conductive layers are electrically coupled through the pipe region.

9. The method of claim 1, further comprising:
   performing an etch process until the channel layer formed at a lower side at a center of the pipe region is exposed.

10. The method of claim 9, wherein the etch process is performed to remove part of the second insulating layer.

11. The method of claim 1, wherein the second conductive layer is formed of a polysilicon layer to fill the pipe region.

12. The method of claim 1, wherein the second conductive layer is formed using the exposed channel layer as a seed.

13. A method of manufacturing a semiconductor device, comprising:

forming a structure including U-shaped channel structures vertically passing through first insulating layers and first conductive layers alternately stacked on a substrate, and electrically coupled in the substrate, and a slit vertically passing through the first insulating layers and the first conductive layers formed at a center of the U-shaped channel structures;

forming a first passivation layer on a lateral surface of the slit;

exposing a channel layer of the U-shaped channel structures through a lower side of the slit; and filling the slit, through which the channel layer is exposed, with a second conductive layer, wherein the filling of the slit, through which the channel layer is exposed, with the second conductive layer includes:

forming a third conductive layer at the lower side of the slit through which the channel layer is exposed; and filling the slit, in which the third conductive layer is formed, with a fourth conductive layer.

14. The method of claim 13, wherein the fourth conductive layer is formed of a material having lower resistance than the third conductive layer.

15. The method of claim 14, further comprising:

forming a fifth conductive to be in contact with the fourth conductive layer.

16. A method of manufacturing a semiconductor device, comprising:

forming a structure including U-shaped channel structures vertically passing through first insulating layers and first conductive layers alternately stacked on a substrate, and electrically coupled through a pipe region in the substrate, and a slit vertically passing through the first insulating layers and the first conductive layers formed at a center of the U-shaped channel structures, wherein the U-shaped channel structures include a memory layer, a channel layer, and a third insulating layer;

forming a first passivation layer on a lateral surface of the slit;

exposing the channel layer formed at the pipe region through a lower side of the slit;

filling the pipe region with a second conductive layer for a common source line; and filling the slit with a third conductive layer for the common source line, wherein the second conductive layer is formed using the exposed channel layer formed at the pipe region as a seed.

* * * * *